United States Patent
Yang

(10) Patent No.: US 9,230,945 B2
(45) Date of Patent: Jan. 5, 2016

(54) LIGHT-EMITTING DEVICE

(71) Applicant: Lextar Electronics Corporation, Hsinchu (TW)

(72) Inventor: Li-Cheng Yang, Zhongli (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 234 days.

(21) Appl. No.: 14/020,994

(22) Filed: Sep. 9, 2013

(65) Prior Publication Data
US 2014/0139144 A1 May 22, 2014

(30) Foreign Application Priority Data
Nov. 22, 2012 (TW) .............................. 101143746 A

(51) Int. Cl.
*H05B 41/392* (2006.01)
*H01L 25/16* (2006.01)
*H01L 23/00* (2006.01)

(52) U.S. Cl.
CPC .............. *H01L 25/167* (2013.01); *H01L 24/97* (2013.01); *H01L 2224/48091* (2013.01)

(58) Field of Classification Search
USPC ................................................ 315/291–311
See application file for complete search history.

(56) References Cited

U.S. PATENT DOCUMENTS

| 4,402,037 | A  | * | 8/1983  | Iwamura et al.    | 361/679.61 |
|-----------|----|---|---------|-------------------|------------|
| 6,198,225 | B1 | * | 3/2001  | Kano et al.       | 315/169.3  |
| 2002/0005696 | A1 | * | 1/2002  | Yamazaki et al.   | 315/169.3  |
| 2002/0070681 | A1 | * | 6/2002  | Shimizu et al.    | 315/246    |
| 2005/0212420 | A1 | * | 9/2005  | Sakakura et al.   | 313/512    |
| 2006/0012988 | A1 | * | 1/2006  | Hsieh et al.      | 362/231    |
| 2010/0039044 | A1 | * | 2/2010  | Hatakenaka et al. | 315/291    |
| 2010/0237780 | A1 | * | 9/2010  | Kim               | 315/52     |
| 2010/0320902 | A1 | * | 12/2010 | Yu                | 315/32     |
| 2011/0050111 | A1 | * | 3/2011  | Tanaka et al.     | 315/185 R  |

FOREIGN PATENT DOCUMENTS

TW           M424606           3/2012

* cited by examiner

*Primary Examiner* — Brandon S Cole
(74) *Attorney, Agent, or Firm* — McClure, Qualey & Rodack, LLP

(57) ABSTRACT

A light-emitting device is provided. The light-emitting device comprises a substrate and a light-emitting element. The substrate comprises a first variable resistor, a second variable resistor, an insulation portion and a carrier. The insulation portion is located between the first variable resistor and the second variable resistor. The carrier is surrounded by the insulation portion, and the light-emitting element is disposed on the carrier. The first variable resistor, the second variable resistor and the insulation portion respectively penetrate the substrate.

7 Claims, 3 Drawing Sheets

LIGHT-EMITTING DEVICE

This application claims the benefit of Taiwan application Serial No. 101143746, filed Nov. 22, 2012, the subject matter of which is incorporated herein by reference.

BACKGROUND OF THE INVENTION

1. Field of the Invention

The invention relates in general to a light-emitting device, and more particularly to a light-emitting device capable of diverting static electricity.

2. Description of the Related Art

To divert static electricity, a Zener diode is additionally required to be disposed on a substrate of conventional light emitting diode. However, the Zener diode occupies extra space of the light emitting diode and the disposition of the Zener diode requires additional processing procedures.

SUMMARY OF THE INVENTION

The invention is directed to a light-emitting device, which diverts static electricity with variable resistors and occupies less space of the light-emitting device.

According to an embodiment of the present invention, a light-emitting device is provided. The light-emitting device comprises a substrate and a light-emitting element. The substrate comprises a first variable resistor and a second variable resistor, an insulation portion and a carrier. The insulation portion is located between the first variable resistor and the second variable resistor. The carrier is surrounded by the insulation portion. The light-emitting element is disposed on the carrier. The first variable resistor, the second variable resistor and the insulation portion respectively penetrate the substrate.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
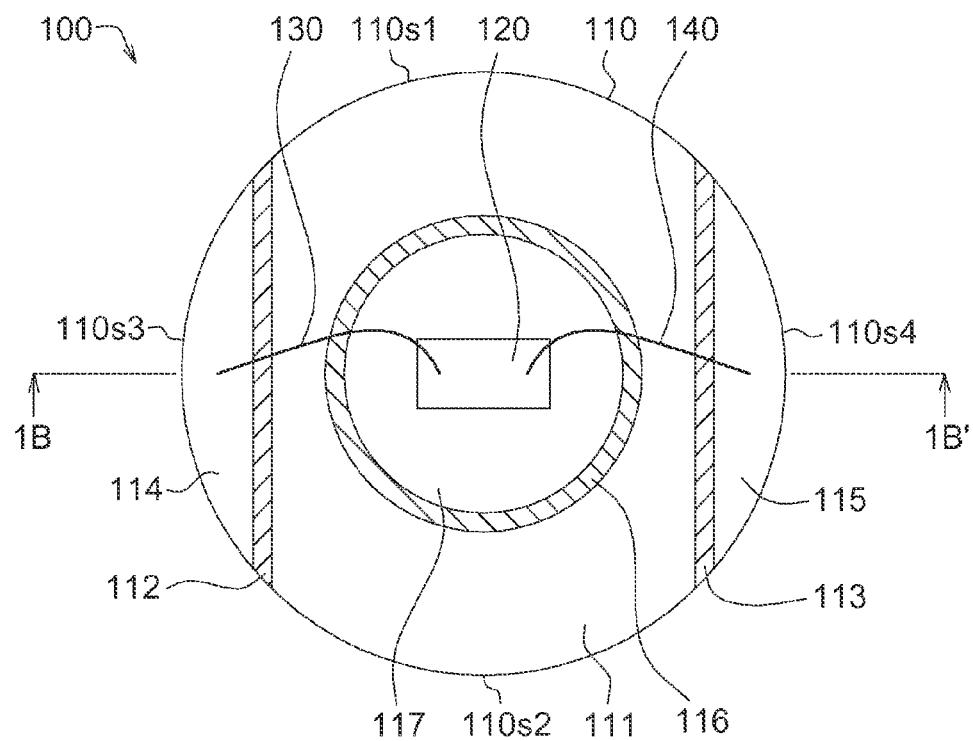
FIG. 1A shows a top view of a light-emitting device according to an embodiment of the invention.

Referring to FIG. 1A, a top view of a light-emitting device according to an embodiment of the invention is shown. The light-emitting device 100 comprises a substrate 110, a light-emitting element 120, a first conductive wire 130 and a second conductive wire 140.

The substrate 110 is formed by a conductive material such as metal or graphite. The substrate 110 comprises an electrostatic diverter 111, a first variable resistor 112, a second variable resistor 113, a first electrode 114, a second electrode 115, an insulation portion 116, and a carrier 117. In the present example, the shape of the substrate 110 is exemplified by a circular shape. However, the cross section of the substrate 110 can be a curved shape or a polygon consisting of straight lines and/or curves. The curved shape is such as an ellipse, and the polygon is such as a triangle, a rectangle or a trapezoid.

The electrostatic diverter 111 connects the first variable resistor 112 and the second variable resistor 113, and is isolated from the first electrode 114 and the second electrode 115 through the first variable resistor 112 and the second variable resistor 113. When no static electricity is working on the first variable resistor 112 and the second variable resistor 113, the first variable resistor 112 and the second variable resistor 113 are insulators which electrically isolate the electrostatic diverter 111, the first electrode 114 and the second electrode 115 from one another and avoid the first electrode 114 and the second electrode 115 being electrically connected to each other through the electrostatic diverter 111. When static electricity is working on the first variable resistor 112 and/or the second variable resistor 113, due to the transient voltage of static electricity being very high, the transient voltage results in a phenomenon of electron tunneling in the first variable resistor 112 and/or the second variable resistor 113 (the resistances of the first variable resistor 112 and/or the second variable resistor 113 become smaller), such that static electricity can be conducted to the exterior through the first variable resistor 112 and/or the second variable resistor 113. Accordingly, static electricity is prevented from flowing through the light-emitting element 120 to damage the light-emitting element 120.

In the present example, the electrostatic diverter 111 is a closed ring surrounding the insulation portion 116, the carrier 117 and the light-emitting element 120. In another example, electrostatic diverter 111 can be an open ring.

Two ends of the first variable resistor 112 are exposed from the first edge lateral surface 110s1 of the substrate 110 and the second edge lateral surface 110s2 of the substrate 110 respectively, wherein the first edge lateral surface 110s1 and the second edge lateral surface 110s2 are opposite to each other. Likewise, two ends of the second variable resistor 113 are exposed from the first edge lateral surface 110s1 and the second edge lateral surface 110s2 respectively. That is, when viewing toward a top view direction of FIG. 1A, the first variable resistor 112 and the second variable resistor 113 penetrate the substrate 110.

Each of the first variable resistor 112 and the second variable resistor 113 comprises a metal oxide, such as zinc oxide or other suitable elements, and comprises bismuth (Bi) or other suitable elements. If the substrate 110 is a metal substrate, the hardness of metal oxide can reduce the flexibility of the substrate 110 to increase the stiffness of the entire substrate 110.

The first electrode 114 is defined between the third edge lateral surface 110s3 of the substrate 110 and the first variable resistor 112, and the second electrode 115 is defined between the fourth edge lateral surface 110s4 of the substrate 110 and the second variable resistor 113, wherein the third edge lateral surface 110s3 and the fourth edge lateral surface 110s4 are opposite to each other. The first conductive wire 130 connects the light-emitting element 120 and the first electrode 114, and the second conductive wire 140 connects the light-emitting element 120 and the second electrode 115.

The insulation portion 116 is located between the first variable resistor 112 and the second variable resistor 113. In the present example, the insulation portion 116, being a closed ring, completely isolates the carrier 117 from the electrostatic diverter 111 to avoid the carrier 117 and the electrostatic diverter 111 being electrically connected to each other.

As long as the carrier 117 and electrostatic diverter 111 are electrically isolated from each other, the insulation portion 116 can also be an open ring.

Figure 1B:
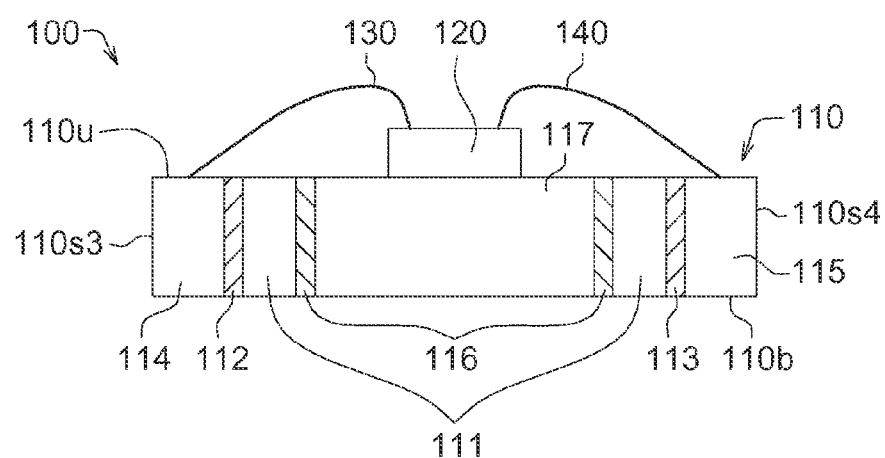
FIG. 1B shows a cross-section along a direction 1B-1B' of FIG. 1A.

Referring to FIG. 1B, a cross-section along a direction 1B-1B' of FIG. 1A is shown. The insulation portion 116, the first variable resistor 112 and the second variable resistor 113 respectively penetrate to the lower surface 110b from the upper surface 110u of the substrate 110, such that the insulation portion 116, the first variable resistor 112 and the second variable resistor 113 are isolated from one another.

The carrier 117 is surrounded by the insulation portion 116, which avoids the carrier 117 being electrically connected to the electrostatic diverter 111.

The light-emitting element 120, such as a light emitting diode or other light source, is disposed on the carrier 117.

Referring to FIGS. 2A~2F, processes of manufacturing a light-emitting device according to an embodiment of the invention are shown.

Figure 2A:
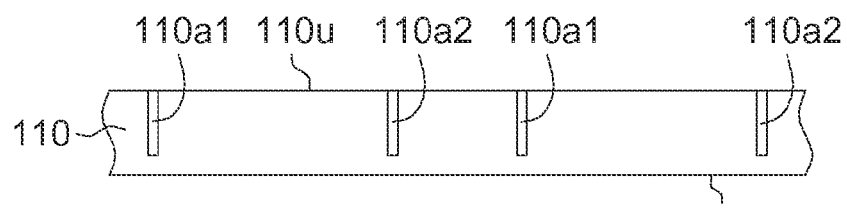
FIGS. 2A~2F are processes of manufacturing a light-emitting device according to an embodiment of the invention.

As indicated in FIG. 2A, at least a first groove 110a1 and at least a second groove 110a2 are formed on the substrate 110 by such as a laser or an etching process, wherein the first groove 110a1 and the second groove 110a2 is extended to the lower surface 110b from the upper surface 110u of the substrate 110 without penetrating to the bottom of the substrate 110.

Figure 2B:
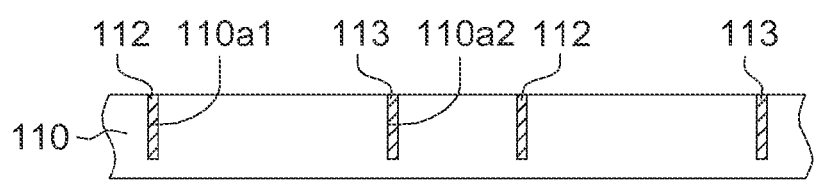

As indicated in FIG. 2B, a first groove 110a1 and a second groove 110a2 are filled up with a first variable resistor 112 and a second variable resistor 113 respectively by such as a coating or filling process.

Figure 2C:
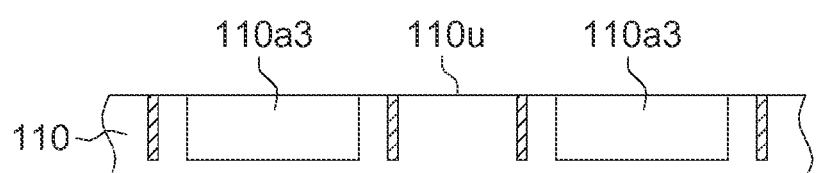

As indicated in FIG. 2C, at least an opening 110a3 is formed on the substrate 110 by such as a laser or an etching process, wherein the opening 110a3 is extended to the lower surface 110b from the upper surface 110u of the substrate 110 without penetrating to the bottom of the substrate 110.

The formation sequence of the first groove 110a1, the second groove 110a2 and the opening 110a3 is not limited by the exemplification of the present embodiment. In an example, the opening 110a3 can be formed before the first groove 110a1 and the second groove 110a2 are formed. Or, the first groove 110a1 the second groove 110a2 and the opening 110a3 can be formed concurrently. Besides, the first variable resistor 112 and the second variable resistor 113 can be formed after the first groove 110a1, the second groove 110a2 and the opening 110a3 are already formed.

Figure 2D:
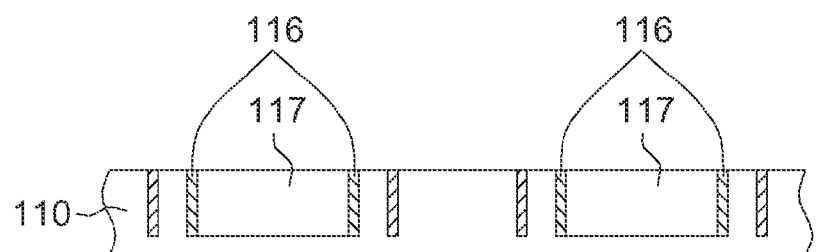

As indicated in FIG. 2D, an insulation portion 116 is formed on an inner wall of the opening 110a3 by a coating or bonding process. In another example, the insulation portion 116 can be formed between the carrier 117 and an inner wall of the opening 110a3 after the carrier 117 is disposed.

As indicated in FIG. 2D, at least a carrier 117 is formed in the corresponding opening 110a3, wherein the insulation portion 116 is located between the carrier 117 and an inner wall of the opening 110a3. In the present example, the insulation portion 116 has viscosity for fixing the carrier 117. In another example, the insulation portion 116 does not have viscosity. Under such design, the insulation portion 116 can be tightly disposed between the carrier 117 and an inner wall of the opening 110a3 for fixing the carrier 117.

Figure 2E:
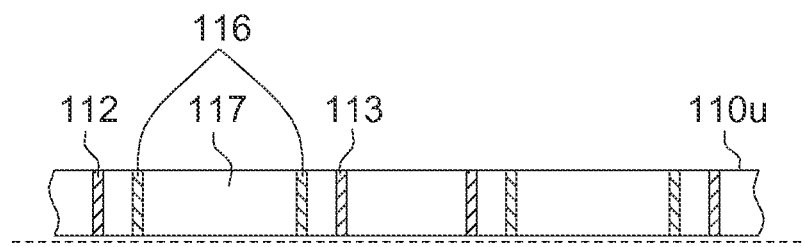

As indicated in FIG. 2E, a part of material is removed from the lower surface 110b (FIG. 2F) of the substrate 110 to expose the first variable resistor 112, the second variable resistor 113, the insulation portion 116 and the carrier 117.

Figure 2F:
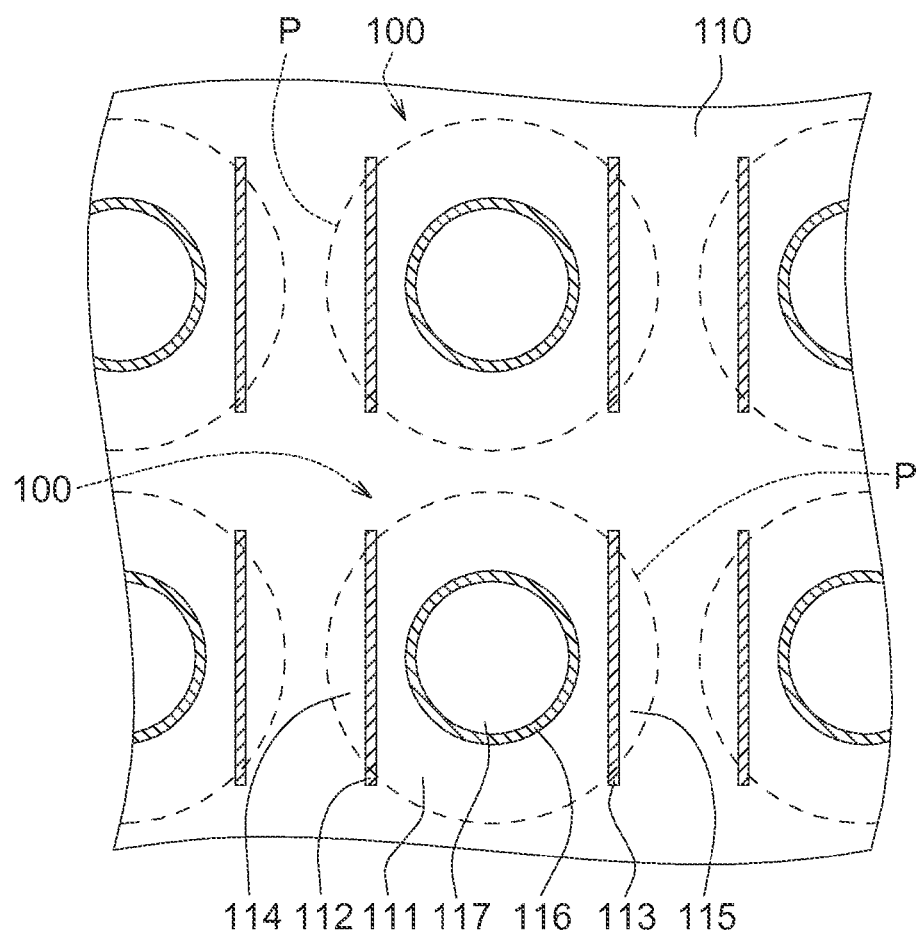

As indicated in FIG. 2F (a top view of FIG. 2E), at least a cutting path P is formed on the substrate 110 to form at least a light-emitting device 100 of FIG. 1A. The cutting path P forms the first edge lateral surface 110s1, the second edge lateral surface 110s2, the third edge lateral surface 110s3 and the fourth edge lateral surface 110s4 on the substrate 110 (FIG. 1A).

Then, at least a light-emitting element 120 (FIG. 1A) is disposed on the carrier 117 (FIG. 2F). Then, the first conductive wire 130 (FIG. 1A) connecting the light-emitting element 120 and the first electrode 114, and the second conductive wire 140 (FIG. 1A) connecting the light-emitting element 120 and the second electrode 115 are respectively formed. In another example, the light-emitting element 120, the first conductive wire 130 and the second conductive wire 140 can also be formed before the cutting process.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light-emitting device, comprising:
a substrate formed by a conductive material and having an upper surface and a lower surface opposite to the upper surface, the substrate comprising:
a first variable resistor and a second variable resistor, each of the first variable resistor and the second variable resistor comprising a metal oxide;
an insulation portion located between the first variable resistor and the second variable resistor; and
a carrier surrounded by the insulation portion; and
a light-emitting element disposed on the carrier and the upper surface;
wherein, the first variable resistor, the second variable resistor and the insulation portion respectively penetrate to the lower surface from the upper surface of the substrate.

2. The light-emitting device according to claim 1, wherein the substrate has a first edge lateral surface and a second edge lateral surface opposite to the first edge lateral surface, two ends of the first variable resistor are exposed from the first edge lateral surface and the second edge lateral surface respectively, and two ends of the second variable resistor are exposed from the first edge lateral surface and the second edge lateral surface respectively.

3. The light-emitting device according to claim 1, wherein the substrate has a third edge lateral surface and a fourth edge lateral surface opposite to the third edge lateral surface, a first electrode is defined between the third edge lateral surface and the first variable resistor, a second electrode is defined between the fourth edge lateral surface and the second variable resistor, and the light-emitting device further comprises:
a first conductive wire connecting the light-emitting element and the first electrode; and
a second conductive wire connecting the light-emitting element and the second electrode.

4. The light-emitting device according to claim 1, wherein the first variable resistor and the second variable resistor further comprise bismuth (Bi).

5. The light-emitting device according to claim 1, wherein the metal oxide is zinc oxide.

6. The light-emitting device according to claim 1, wherein the insulation portion is a closed ring-shaped insulation portion.

7. The light-emitting device according to claim 1, wherein the conductive material is made from metal or graphite.

\* \* \* \* \*